(12) United States Patent
Kumazawa et al.

(10) Patent No.: US 10,177,236 B2
(45) Date of Patent: Jan. 8, 2019

(54) METHOD OF MANUFACTURING SEMICONDUCTOR DEVICE

(71) Applicant: TOYOTA JIDOSHA KABUSHIKI KAISHA, Toyota-shi, Aichi (JP)

(72) Inventors: Teruaki Kumazawa, Toyota (JP); Narumasa Soejima, Nagakute (JP); Yuichi Takeuchi, Kariya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/784,877

(22) Filed: Oct. 16, 2017

(65) Prior Publication Data

US 2018/0145144 A1 May 24, 2018

(30) Foreign Application Priority Data

Nov. 21, 2016 (JP) .................................. 2016-226165

(51) Int. Cl.
| | | |
|---|---|---|
| H01L 21/04 | (2006.01) | |
| H01L 21/285 | (2006.01) | |
| H01L 29/47 | (2006.01) | |
| H01L 29/66 | (2006.01) | |
| H01L 29/06 | (2006.01) | |
| H01L 29/16 | (2006.01) | |
| H01L 29/872 | (2006.01) | |

(52) U.S. Cl.
CPC .......... *H01L 29/47* (2013.01); *H01L 21/0465* (2013.01); *H01L 21/0495* (2013.01); *H01L 21/28537* (2013.01); *H01L 21/28581* (2013.01); *H01L 29/0619* (2013.01); *H01L 29/1608* (2013.01); *H01L 29/6606* (2013.01); *H01L 29/66143* (2013.01); *H01L 29/872* (2013.01)

(58) Field of Classification Search
CPC ............................ H01L 29/47; H01L 21/0465
See application file for complete search history.

(56) References Cited

U.S. PATENT DOCUMENTS

| | | | |
|---|---|---|---|
| 2004/0256613 A1* | 12/2004 | Oda | ................ H01L 21/823807 257/19 |
| 2010/0244049 A1 | 9/2010 | Yamamoto et al. | |
| 2015/0348773 A1* | 12/2015 | Zhu | ..................... C23C 14/0036 438/503 |

FOREIGN PATENT DOCUMENTS

JP        2010-225877 A    10/2010

* cited by examiner

*Primary Examiner* — Moazzam Hossain
*Assistant Examiner* — Omar Mojaddedi
(74) *Attorney, Agent, or Firm* — Oliff PLC (57) ABSTRACT

A method of manufacturing a semiconductor device includes: setting a plurality of main semiconductor wafers and a plurality of sub semiconductor wafers in a load lock chamber of an electrode forming equipment; repeating a wafer-transfer and electrode-formation process of transferring at least one of the main semiconductor wafers from the load lock chamber to the film formation chamber in a state where the load lock chamber and the film formation chamber are decompressed and then forming a surface electrode on a surface of the at least one main semiconductor wafer transferred in the film formation chamber; removing the main semiconductor wafers on which the surface electrodes have been formed and the sub semiconductor wafers from the electrode forming equipment without forming an electrode on the sub semiconductor wafers by the electrode forming equipment; and making the surface electrodes Schottky-contact the main semiconductor wafers.

7 Claims, 8 Drawing Sheets

| Slot 25 | Second Semiconductor Wafer 32 |
| Slot 24 | Second Semiconductor Wafer 32 |
| Slot 23 | Second Semiconductor Wafer 32 |
| Slot 22 | Second Semiconductor Wafer 32 |
| Slot 21 | Second Semiconductor Wafer 32 |
| Slot 20 | Second Semiconductor Wafer 32 |
| Slot 19 | Second Semiconductor Wafer 32 |
| Slot 18 | Second Semiconductor Wafer 32 |
| Slot 17 | Second Semiconductor Wafer 32 |
| Slot 16 | Second Semiconductor Wafer 32 |
| Slot 15 | Second Semiconductor Wafer 32 |
| Slot 14 | Second Semiconductor Wafer 32 |
| Slot 13 | First Semiconductor Wafer 31 |
| Slot 12 | First Semiconductor Wafer 31 |
| Slot 11 | First Semiconductor Wafer 31 |
| Slot 10 | First Semiconductor Wafer 31 |
| Slot 9 | First Semiconductor Wafer 31 |
| Slot 8 | First Semiconductor Wafer 31 |
| Slot 7 | First Semiconductor Wafer 31 |
| Slot 6 | First Semiconductor Wafer 31 |
| Slot 5 | First Semiconductor Wafer 31 |
| Slot 4 | First Semiconductor Wafer 31 |
| Slot 3 | First Semiconductor Wafer 31 |
| Slot 2 | First Semiconductor Wafer 31 |
| Slot 1 | Dummy Semiconductor Wafer |

92a
92
Sub Semiconductor Wafers
Main Semiconductor Wafers

FIG.10

| Slot 25 | Third Semiconductor Wafer 33 |
| Slot 24 | Third Semiconductor Wafer 33 |
| Slot 23 | Third Semiconductor Wafer 33 |
| Slot 22 | Third Semiconductor Wafer 33 |
| Slot 21 | Third Semiconductor Wafer 33 |
| Slot 20 | Third Semiconductor Wafer 33 |
| Slot 19 | Third Semiconductor Wafer 33 |
| Slot 18 | Third Semiconductor Wafer 33 |
| Slot 17 | Third Semiconductor Wafer 33 |
| Slot 16 | Third Semiconductor Wafer 33 |
| Slot 15 | Third Semiconductor Wafer 33 |
| Slot 14 | Third Semiconductor Wafer 33 |
| Slot 13 | Second Semiconductor Wafer 32 |
| Slot 12 | Second Semiconductor Wafer 32 |
| Slot 11 | Second Semiconductor Wafer 32 |
| Slot 10 | Second Semiconductor Wafer 32 |
| Slot 9 | Second Semiconductor Wafer 32 |
| Slot 8 | Second Semiconductor Wafer 32 |
| Slot 7 | Second Semiconductor Wafer 32 |
| Slot 6 | Second Semiconductor Wafer 32 |
| Slot 5 | Second Semiconductor Wafer 32 |
| Slot 4 | Second Semiconductor Wafer 32 |
| Slot 3 | Second Semiconductor Wafer 32 |
| Slot 2 | Second Semiconductor Wafer 32 |
| Slot 1 | Dummy Semiconductor Wafer |

92a
92
Sub Semiconductor Wafers
Main Semiconductor Wafers

METHOD OF MANUFACTURING SEMICONDUCTOR DEVICE

TECHNICAL FIELD

The art disclosed in the present teachings relates to a method of manufacturing a semiconductor device that includes a Schottky electrode.

BACKGROUND

Japanese Patent Application Publication No. 2010-225877 discloses a technology of forming a Schottky electrode on a surface of a semiconductor wafer containing SiC (silicon carbide) as a main material thereof. In this technology, a portion of the Schottky electrode that contacts the semiconductor wafer is constituted of an oxide layer. According to this technology, a barrier height of the Schottky electrode can be increased.

SUMMARY

When a Schottky electrode is formed on a surface of a semiconductor wafer containing SiC as a main material thereof, an electrode forming equipment that has a load lock chamber and a film formation chamber can be used. When such an electrode forming equipment is used, a plurality of semiconductor wafers is set in the load lock chamber first. Next, the load lock chamber and the film formation chamber are decompressed. Next, a predetermined number (e.g., one) of semiconductor wafers are transferred from the load lock chamber to the film formation chamber, and a surface electrode is formed on a surface of each of the semiconductor wafer(s) in the film formation chamber. When the formation of the surface electrode(s) in the film formation chamber is completed, another semiconductor wafer(s) are transferred from the load lock chamber to the film formation chamber, and a surface electrode is formed on each of the transferred semiconductor wafer(s). By this processing being repeated, the surface electrodes are formed on the surfaces of the respective semiconductor wafers. Subsequently, the semiconductor wafers are removed (taken out) from the electrode forming equipment, and subjected to a thermal treatment or the like, thereby enabling the surface electrodes to be made to Schottky-contact the respective semiconductor wafers. Alternatively, the surface electrodes may be made to Schottky-contact the respective semiconductor wafers simultaneously with the formation of the surface electrodes themselves. In other words, the surface electrodes become Schottky electrodes.

It was revealed that, in a case of forming the Schottky electrodes by using the electrode forming equipment mentioned above, barrier heights of the Schottky electrodes varied for each of the semiconductor wafers. More specifically, it was revealed that, among the plurality of semiconductor wafers set in the load lock chamber, the barrier heights of the Schottky electrodes were higher in the semiconductor wafers on which the surface electrodes were formed in earlier timings (hereinafter referred to as earlier-stage semiconductor wafers) than in the semiconductor wafers on which the surface electrodes were formed in later timings (hereinafter referred to as later-stage semiconductor wafers). Accordingly, the barrier heights of the Schottky electrodes are difficult to control accurately during mass production. The present teachings therefore provide a technology of controlling barrier heights of Schottky electrodes more accurately.

The inventors of the present application assumed that one of the causes of the difference in barrier heights might be an influence of moisture amounts on surfaces of the semiconductor wafers. In general, a trace amount of moisture exists on a surface of a semiconductor wafer. It may be assumed that, when a Schottky electrode is formed on the surface of the semiconductor wafer, oxygen atoms in the moisture are captured into an interface between the semiconductor wafer and the Schottky electrode (a Schottky interface). The oxygen atoms are assumed to exist as a certain oxide in the Schottky interface. Since the barrier height is greatly influenced by a state of the Schottky interface, it may be assumed that the barrier height changes depending on an amount of oxygen atoms that exist in the Schottky interface. In other words, it may be assumed that the barrier height of the Schottky electrode changes depending on the amount of moisture that exists on the surface of the semiconductor wafer when the Schottky electrode is formed.

When the plurality of semiconductor wafers is set in the load lock chamber and the load lock chamber is decompressed, moisture leaves (is vaporized from) the surfaces of the semiconductor wafers. Accordingly, the moisture amount on each of the surfaces of the semiconductor wafers decreases while each of the semiconductor wafers is waiting in the load lock chamber. Since the earlier-stage semiconductor wafers wait in the load lock chamber for a short time, the surface electrodes are formed on their surfaces in a state where the surfaces each has a large moisture amount. Thus it is assumed that, in the earlier-stage semiconductor wafers, more oxygen atoms are captured into the Schottky interfaces, and thus the barrier heights of the Schottky interfaces are large. On the other hand, since the later-stage semiconductor wafers wait in the load lock chamber for a long time, the surface electrodes are formed on their surfaces in a state where the surfaces each has a small moisture amount. Thus it is assumed that, in the later-stage semiconductor wafers, less oxygen atoms are captured into the Schottky interfaces, and thus the barrier heights of the Schottky interfaces are low. Based on these assumptions described above, the present teachings propose the following manufacturing method.

A method of manufacturing a semiconductor device disclosed herein may comprise: setting a plurality of main semiconductor wafers comprising SiC as a main material thereof and a plurality of sub semiconductor wafers in an electrode forming equipment which comprises a load lock chamber and a film formation chamber, wherein the main semiconductor wafers and the sub semiconductor wafers are set in the load lock chamber; repeating a wafer-transfer and electrode-formation process of transferring at least one of the main semiconductor wafers from the load lock chamber to the film formation chamber in a state where the load lock chamber and the film formation chamber are decompressed and then forming a surface electrode on a surface of the at least one main semiconductor wafer transferred in the film formation chamber; removing the main semiconductor wafers on which the surface electrodes have been formed and the sub semiconductor wafers from the electrode forming equipment without forming an electrode on the sub semiconductor wafers by the electrode forming equipment; and making the surface electrodes Schottky-contact the main semiconductor wafers.

It should be noted that, the "sub semiconductor wafers" described above may be semiconductor wafers comprising SiC as a main material thereof, or may be other semiconductor wafers. Moreover, each of the "main semiconductor wafers" and the "sub semiconductor wafers" described above may include an insulating layer and the like on its surface. Moreover, the "making of the surface electrodes Schottky-contact the main semiconductor wafers" may be performed at any arbitrary timing. For example, the "making of the surface electrodes Schottky-contact the main semiconductor wafers" may be performed after the formation of the surface electrodes. Alternatively, the surface electrodes may Schottky-contact the main semiconductor wafers simultaneously with the formation of the surface electrodes themselves on the surfaces of the main semiconductor wafers. In this case, the "making of the surface electrodes Schottky-contact the main semiconductor wafers" can be regarded as being performed simultaneously with the formation of the surface electrode(s) on the surfaces of the main semiconductor wafer(s).

In this manufacturing method, in the setting of the pluralities of main and sub semiconductor wafers, the main semiconductor wafers and the sub semiconductor wafers are set in the load lock chamber. Subsequently, in the repeating of the wafer-transfer and electrode-formation process, the load lock chamber and the film formation chamber are decompressed. During the repeating of the wafer-transfer and electrode-formation process, the main semiconductor wafers are sequentially transferred to the film formation chamber, and the surface electrodes are formed on their surfaces. After the surface electrodes have been formed on the surfaces of the respective main semiconductor wafers, the main semiconductor wafers and the sub semiconductor wafers are removed from the electrode forming equipment in the removal of the pluralities of main and sub semiconductor wafers, without any electrode being formed on the surfaces of the sub semiconductor wafers. That is, in the repeating of the wafer-transfer and electrode-formation process, no electrodes are formed on the surfaces of the sub semiconductor wafers. In other words, in the conventional manufacturing method, the surface electrodes are formed on all of the semiconductor wafers set in the load lock chamber, whereas in the manufacturing method disclosed in the present teachings the surface electrodes are formed on the main semiconductor wafers and not on the sub semiconductor wafers among the semiconductor wafers set in the load lock chamber. In this regard, the manufacturing method disclosed in the present teachings differs from the conventional manufacturing method. In the making of the surface electrodes Schottky-contact the main semiconductor wafers, the surface electrodes Schottky-contact the main semiconductor wafers. That is, the Schottky electrodes are formed.

In the conventional manufacturing method, when the load lock chamber is decompressed, moisture leaves the surfaces of the semiconductor wafers in the load lock chamber. A moisture concentration in a space within the load lock chamber is high immediately after the decompression of the load lock chamber is started. As time elapses after the start of the decompression of the load lock chamber, the moisture concentration in the space within the load lock chamber drops, as a result of which a moisture amount on the surface of each semiconductor wafer drops. In the conventional manufacturing method, since the surface electrodes (the electrodes that are to be the Schottky electrodes) are formed on all of the semiconductor wafers in the load lock chamber, the later-stage semiconductor wafers (a last semiconductor wafer, in particular) wait in the load lock chamber long. Accordingly, on the later-stage semiconductor wafers, the surface electrodes are formed in a state where the surfaces of the later-stage semiconductor wafers each has an extremely small amount of moisture. Due to this, the barrier heights of the later-stage semiconductor wafers are significantly smaller than the barrier heights of the earlier-stage semiconductor wafers.

On the other hand, in the manufacturing method disclosed in the present teachings, when the load lock chamber is decompressed, moisture leaves the surfaces of the main and sub semiconductor wafers in the load lock chamber. If a total number of the main and sub semiconductor wafers is made equivalent to a total number of the semiconductor wafers in the conventional manufacturing method, the amount of moisture that can be supplied to the load lock chamber in the manufacturing method disclosed in the present teachings can be made approximately equivalent to or more than the amount of moisture in the conventional manufacturing method. Moreover, in the manufacturing method disclosed in the present teachings, since the surface electrodes (the electrodes that are to become the Schottky electrodes) are formed on the main semiconductor wafers but not on the sub semiconductor wafers, the formation of the Schottky electrodes on all of the main semiconductor wafers requires a short time. Therefore, the time for which the later-stage main semiconductor wafers wait in the load lock chamber is short. Accordingly, by the time when the Schottky electrodes have been formed on the later-stage main semiconductor wafers, the moisture concentration in the space within the load lock chamber does not drop so much. Thus, the moisture amount on each of the surfaces of the later-stage main semiconductor wafers does not drop so much. Accordingly, on the later-stage semiconductor wafers, the surface electrodes are formed in a state where the surfaces of the later-stage semiconductor wafers each has a relatively large amount of moisture. Consequently, although the barrier heights of the later-stage semiconductor wafers are lower than the barrier heights of the earlier-stage semiconductor wafers, the difference therebetween is small.

As such, in the manufacturing method disclosed in the present teachings, the amount of moisture that can be supplied to the load lock chamber is equivalent to or more than the amount of moisture in the conventional manufacturing method, whereas the time for which the later-stage main semiconductor wafers wait in the load lock chamber is short. Therefore, variations in barrier heights of the Schottky electrodes can be suppressed.

Figure 1:
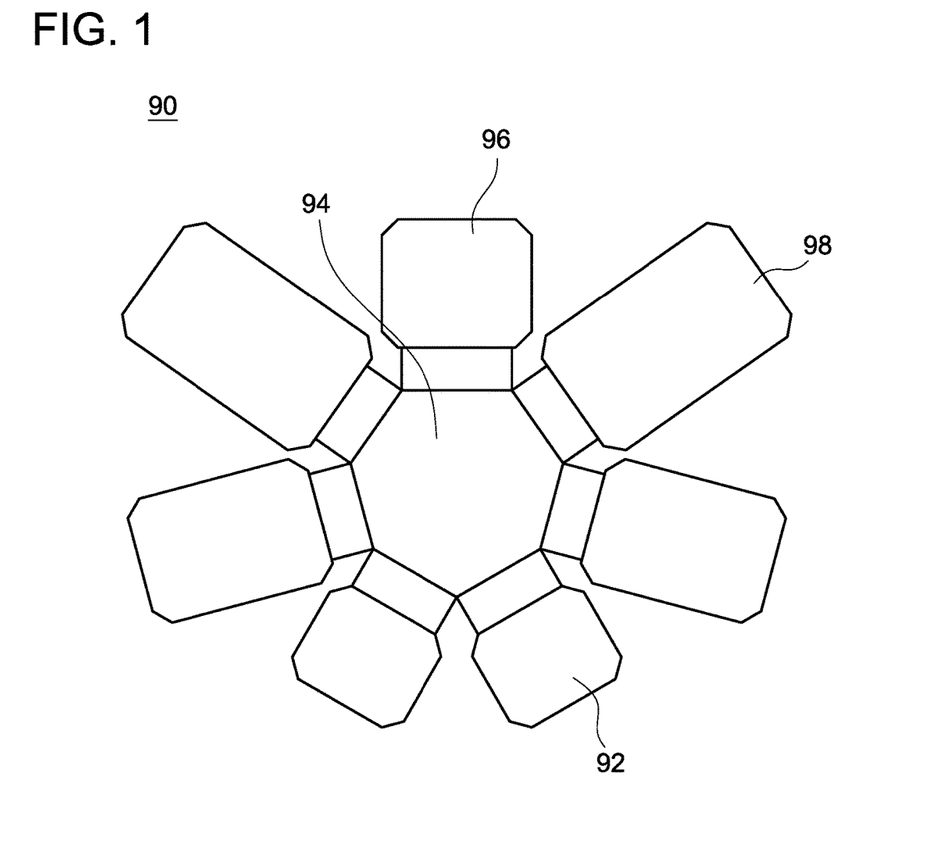
FIG. 1 is a schematic diagram of an electrode forming equipment.

DETAILED DESCRIPTION (Embodiment 1) FIG. 1 illustrates an electrode forming equipment 90 used in a manufacturing method in an embodiment. The electrode forming equipment 90 comprises a load lock chamber 92, a transfer chamber 94, a heating chamber 96, and a film formation chamber 98. It should be noted that, other chambers in the electrode forming equipment 90 are not used in the manufacturing method described below, and hence descriptions thereof will be omitted. The load lock chamber 92, the heating chamber 96, and the film formation chamber 98 are connected to the transfer chamber 94. Between the transfer chamber 94 and each of other chambers (the load lock chamber 92, the heating chamber 96, and the film formation chamber 98), an openable/closable door is provided. Insides of the load lock chamber 92, the transfer chamber 94, the heating chamber 96, and the film formation chamber 98 each can be decompressed. The load lock chamber 92 has a removal port. Via the removal port, semiconductor wafer(s) can be transferred from an outside to the load lock chamber 92, and from the load lock chamber 92 to the outside. A transfer equipment for transferring the semiconductor wafer(s) is provided in the transfer chamber 94. The transfer equipment transfers the semiconductor wafer(s) between the load lock chamber 92, the heating chamber 96, and the film formation chamber 98. The heating chamber 96 can heat semiconductor wafer(s) inside itself. The film formation chamber 98 can form a metal film on each of surface(s) of semiconductor wafer(s).

Figure 2:
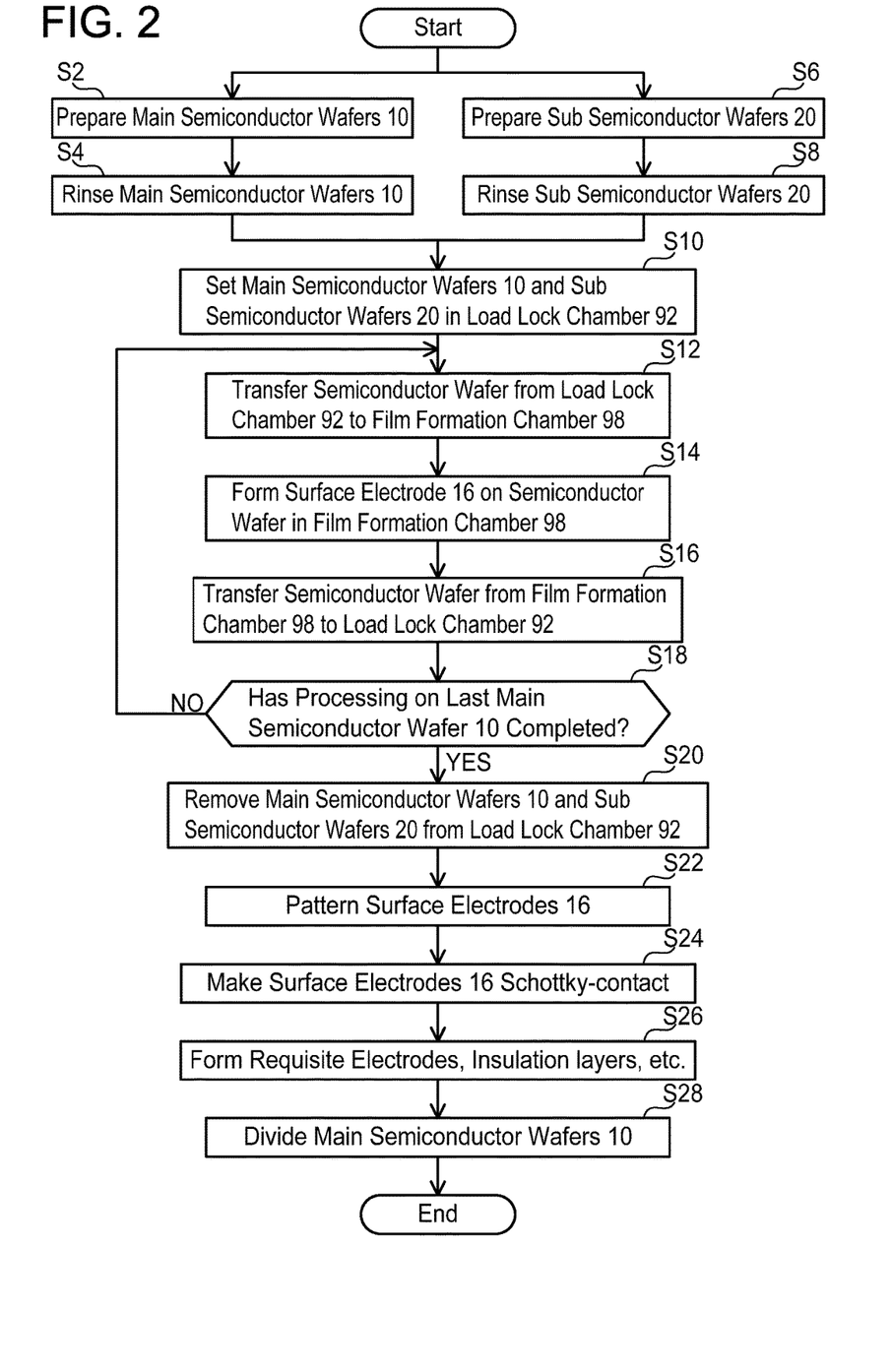
FIG. 2 is a flowchart illustrating a manufacturing method in Embodiment 1.

In Embodiment 1, the electrode forming equipment 90 is used to manufacture semiconductor devices that have Schottky electrodes. Each of the manufactured semiconductor devices may be a Schottky barrier diode (hereinafter referred to as an SBD), or a semiconductor device in which the SBD and another semiconductor element are combined, or another semiconductor device that has the Schottky electrode. FIG. 2 is a flowchart illustrating a method of manufacturing the semiconductor device in Embodiment 1. As shown in FIG. 2, in the manufacturing method in Embodiment 1, main semiconductor wafers 10 and sub semiconductor wafers 20 are used. The main semiconductor wafers 10 and the sub semiconductor wafers 20 are semiconductor wafers comprising SiC as a main material thereof. Each main semiconductor wafer 10 is a semiconductor wafer that is to be a product, and has a semiconductor element structure formed inside itself. Each sub semiconductor wafer 20 is a semiconductor wafer that is not to be a product, and has no semiconductor element structure formed inside itself.

Figure 3:
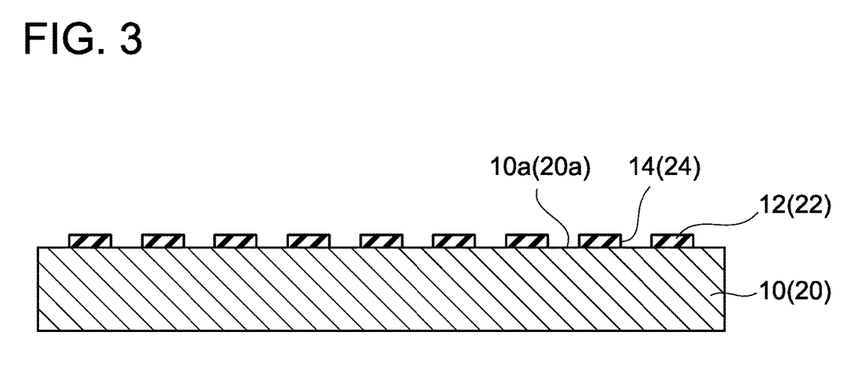
FIG. 3 is a cross-sectional view of a main/sub semiconductor wafer.

FIG. 3 illustrates a cross section of one main semiconductor wafer 10 and sub semiconductor wafer 20. It should be noted that, FIG. 3 illustrates a structure common to the main semiconductor wafer 10 and the sub semiconductor wafer 20. In step S2 in FIG. 2, as shown in FIG. 3, an insulating layer 12 is formed on a surface 10a of each main semiconductor wafer 10. More specifically, the insulating layer 12 is initially formed on an entirety of the surface 10a of each main semiconductor wafer 10 by atmospheric pressure CVD (Chemical Vapor Deposition). The insulating layer 12 is constituted of a silicon oxide. When insulating layer 12 is formed by atmospheric pressure CVD, the insulating layer 12 becomes dense on its surface side, and becomes more porous on a main semiconductor wafer 10 side than on the surface side. Next, the insulating layer 12 is selectively etched to form a plurality of openings 14 in the insulating layer 12 as shown in FIG. 3. In the openings 14, the surface 10a of the main semiconductor wafer 10 is exposed.

In step S4, a natural oxide film is removed with hydrofluoric acid from the surface 10a of each main semiconductor wafer 10. Furthermore, the surface of each main semiconductor wafer 10 is rinsed with running water. At this occasion, moisture is applied to the surface of each main semiconductor wafer 10.

In step S6, as shown in FIG. 3, an insulating layer 22 is formed on a surface 20a of each sub semiconductor wafer 20. More specifically, the insulating layer 22 is initially formed on an entirety of the surface 20a of each sub semiconductor wafer 20 by atmospheric pressure CVD. The insulating layer 22 is constituted of a silicon oxide. When each insulating layer 22 is formed by atmospheric pressure CVD, the insulating layer 22 becomes dense on its surface side, and becomes more porous on a sub semiconductor wafer 20s side than on the surface side. Next, the insulating layer 22 is selectively etched to form a plurality of openings 24 in the insulating layer 22 as shown in FIG. 3. In the openings 24, the surface 20a of the sub semiconductor wafer 20 is exposed. Moreover, on side surfaces of the openings 24, a porous portion of the insulating layer 22 (a portion on the sub semiconductor wafer 20 side) is exposed. It should be noted that, in step S6, the sub semiconductor wafers 20 that each has the structure shown in FIG. 3 may newly be fabricated as described above, but the sub semiconductor wafers 20 that each is pre-fabricated and has the structure shown in FIG. 3 simply may be prepared. For example, the sub semiconductor wafers 20 used in a manufacturing process previously performed may be used again.

In step S8, each sub semiconductor wafer 20 shown in FIG. 3 is rinsed with running water. At this occasion, moisture is applied to the surface of each sub semiconductor wafer 20.

Figure 4:
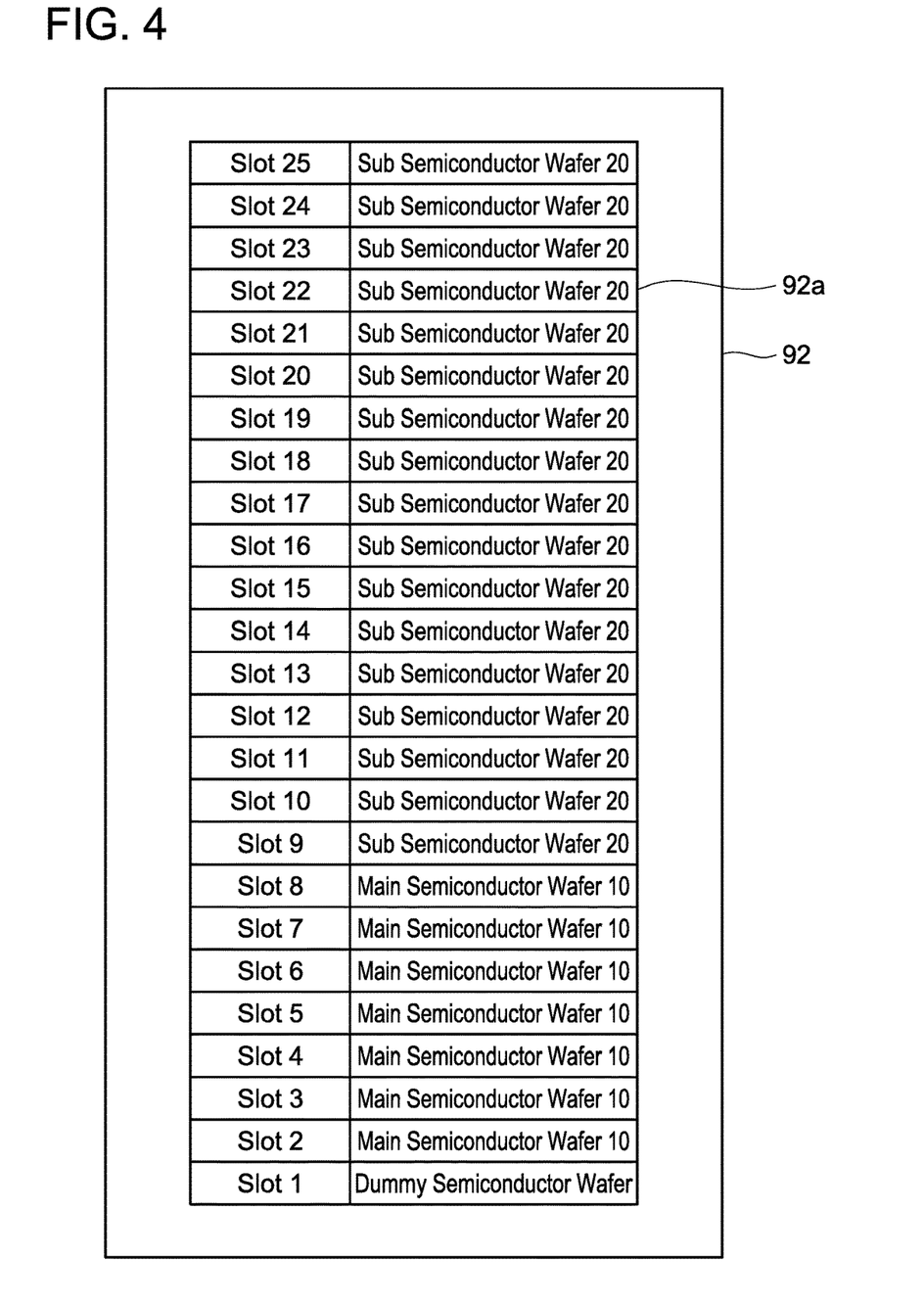
FIG. 4 is an explanatory diagram of set semiconductor wafers.

In step S10, the main semiconductor wafers 10 and the sub semiconductor wafers 20 are set in the load lock chamber 92 in the electrode forming equipment 90. As shown in FIG. 4, a rack 92a that includes a number of slots is provided in the load lock chamber 92. The respective slots are numbered sequentially from a lower side. Provided in slot 1 is a dummy semiconductor wafer. The dummy semiconductor wafer is a semiconductor wafer that is for stabilizing an electrode-formation process, and that is not to become a product. In each of slots 2 to 8, the main semiconductor wafer 10 is provided. In each of slots 9 to 25, the sub semiconductor wafer 20 is provided. After the semiconductor wafers are provided in slots 1 to 25, respectively, the load lock chamber 92 is sealed, and decompressed. It should be noted that, the other chambers (i.e., the transfer chamber 94, the heating chamber 96, the film formation chamber 98, and the like) have already been decompressed.

In step S12, one of the plurality of semiconductor wafers in the load lock chamber 92 is transferred to the film formation chamber 98 by the transfer equipment in the transfer chamber 94. It should be noted that, each semiconductor wafer is transferred to the film formation chamber 98 via the heating chamber 96. Each semiconductor wafer is preheated in the heating chamber 96 before being transferred to the film formation chamber 98. In step S12, the semiconductor wafer provided in the slot with a smallest number, among the semiconductor wafers before the formation of the electrodes, is transferred to the film formation chamber 98. In step S14, a surface electrode (e.g., a metal film made of molybdenum, titanium, nickel, or the like) is formed as a film by sputtering or vapor deposition on a surface of the semiconductor wafer provided in the film formation chamber 98. In step S16, the semiconductor wafer after the formation of the surface electrode is transferred from the film formation chamber 98 to an original slot in the load lock chamber 92 by the transfer equipment in the transfer chamber 94. In step S18, it is determined whether or not the processing on the last main semiconductor wafer 10 (i.e., the main semiconductor wafer 10 in slot 8) has been completed. If a determination of NO is made in step S18, steps S12 to S18 are repeated.

In the initial step S12, the dummy semiconductor wafer in slot 1 is transferred to the film formation chamber 98. In step S14, a surface electrode is formed on the dummy semiconductor wafer and in step S16, the dummy semiconductor wafer is returned to slot 1. Next, a determination of NO is made in step S18, and step S12 is executed again.

Figure 5:
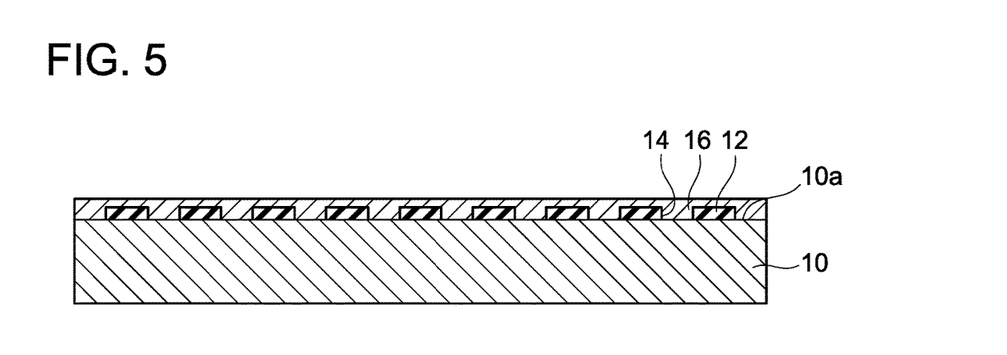
FIG. 5 is a cross-sectional view of the main semiconductor wafer after formation of an electrode.

In the next step S12, the main semiconductor wafer 10 in slot 2 is transferred to the film formation chamber 98. In step S14, as shown in FIG. 5, a surface electrode 16 is formed on the surface 10a of the main semiconductor wafer 10. The surface electrode 16 contacts the main semiconductor wafer 10 in the openings 14. Subsequently, in step S16, the main semiconductor wafer 10 on which the surface electrode 16 is formed is returned to slot 2. Next, in step S18, a determination of NO is made, and step S12 is executed again. In next steps S12 to S18, the surface electrode 16 is formed on the main semiconductor wafer 10 in slot 3. By steps S12 to S18 being repeated, the surface electrodes 16 are respectively formed on the surfaces of the main semiconductor wafers 10 in slots 2 to 8. When the formation of the surface electrode 16 on the main semiconductor wafer 10 in slot 8 has completed, a determination of YES is made in step S18. Then, in step S20, the load lock chamber 92 is opened, and the semiconductor wafers in slots 1 to 25 are removed therefrom to the outside. That is, in this manufacturing method, the surface electrodes 16 are formed on the main semiconductor wafers 10 in slots 2 to 8, whereas no electrodes are formed on the sub semiconductor wafers 20 in slots 9 to 25.

Figure 6:
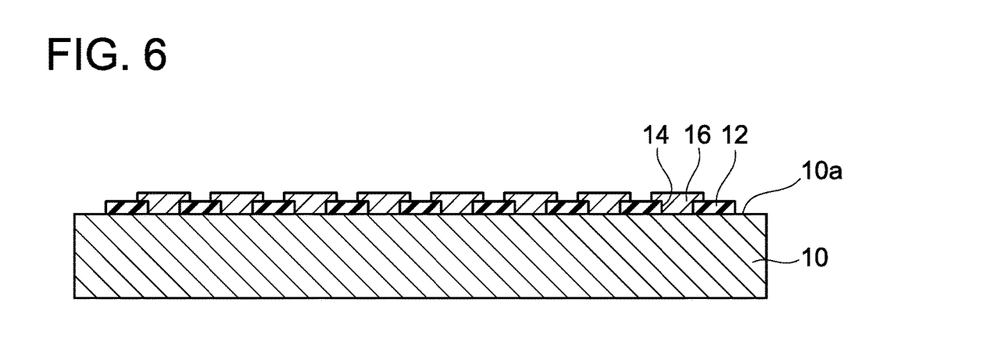
FIG. 6 is a cross-sectional view of the main semiconductor wafer after patterning of the electrode.

After the main semiconductor wafers 10 have been removed from the load lock chamber 92, the respective surface electrodes 16 are patterned in step S22 as shown in FIG. 6. Next, in step S24, each of the main semiconductor wafers 10 is annealed at about 600° C., to alloy the corresponding surface electrode 16 and the main semiconductor wafer 10. Due to this, each of the surface electrodes 16 thereby Schottky-contacts the corresponding main semiconductor wafer 10. Subsequently, other requisite electrodes, insulating layers, and the like are formed on the surfaces of the respective main semiconductor wafers 10 (step S26), and each of the main semiconductor wafers 10 is then divided into a plurality of semiconductor chips (step S28). With the processes described above, the semiconductor devices are completed.

As mentioned above, in the manufacturing method in Embodiment 1, in addition to the main semiconductor wafers 10 on which the surface electrodes 16 are to be formed, the sub semiconductor wafers 20 on which no surface electrodes 16 are to be formed are set in the load lock chamber 92. When the load lock chamber 92 is decompressed after the setting of the semiconductor wafers, moisture is vaporized from the surface of each semiconductor wafer. Since the semiconductor wafers are set in twenty five slots, moisture is supplied to the load lock chamber 92 from the twenty five semiconductor wafers. Thus, the moisture concentration in the space within the load lock chamber 92 rises. Gas in the load lock chamber 92 is constantly discharged to the outside, and the moisture vaporized from each semiconductor wafer gradually decreases, and hence the moisture concentration in the space within the load lock chamber 92 decreases as time passes. However, as the number of the semiconductor wafers provided in the load lock chamber 92 is large, and there are hence a large number of moisture supply sources, as a result of which a speed of decrease in the moisture concentration in the space within the load lock chamber 92 is slow. Since the speed of decrease in the moisture concentration in the space within the load lock chamber 92 is slow, a speed of decrease in the moisture amount on the surface of each main semiconductor wafer 10 is also slow.

Figure 7:
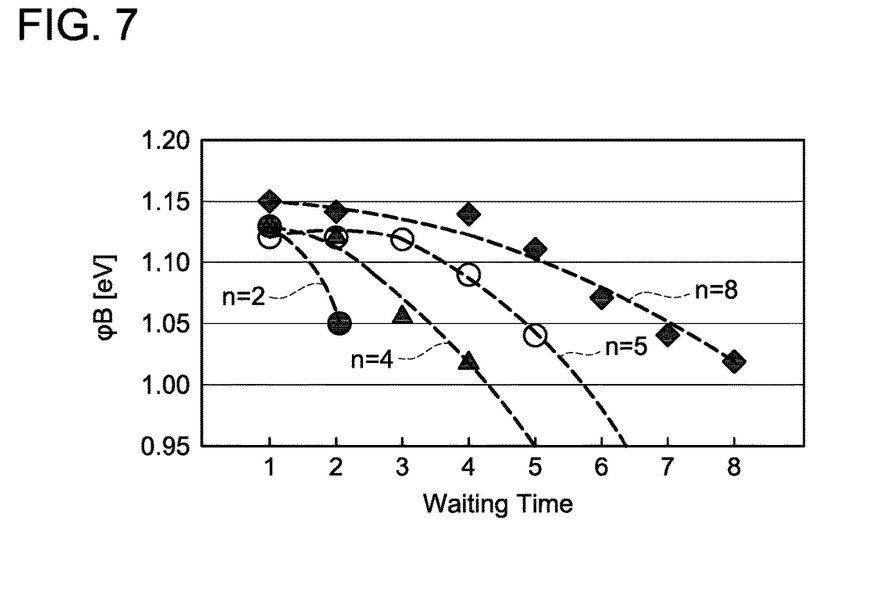
FIG. 7 is a graph illustrating a relation between waiting time and barrier height for every number of set semiconductor wafers.

It should be noted that, FIG. 7 illustrates changes in barrier height ϕB when the Schottky electrode is formed on each semiconductor wafer for different numbers n of the semiconductor wafers set in the load lock chamber 92. It should be noted that, in an experiment of FIG. 7, the Schottky electrodes are formed on all of the semiconductor wafers set in the load lock chamber 92 (i.e., no sub semiconductor wafers are used), and hence a method used in this experiment differs from the manufacturing method in Embodiment 1. An axis of abscissas in FIG. 7 shows waiting time in the load lock chamber 92 with the waiting time normalized. FIG. 7 illustrates, with a graph, cases where the numbers n of the semiconductor wafers set in the load lock chamber 92 are two, four, five, and eight, respectively. As shown in FIG. 7, the larger the number n of the semiconductor wafers set in the load lock chamber 92 becomes, the more moderate the decreasing rate of the barrier height when the waiting time is long becomes. The result of this experiment shows that the larger the number n of the semiconductor wafers set in the load lock chamber 92 becomes, the slower the speed of decrease in the moisture amount on each of the surfaces of the semiconductor wafers becomes. That is, the result of the experiment in FIG. 7 shows that increasing the number of the semiconductor wafers set in the load lock chamber 92, as in Embodiment 1, can slow the speed of decrease in the moisture amount on each of the surfaces of the main semiconductor wafers 10 during the waiting time.

Moreover, in the manufacturing method in Embodiment 1, the surface electrodes 16 are formed on the seven main semiconductor wafers 10 in slots 2 to 8, whereas no surface electrodes 16 are formed on the sub semiconductor wafers 20 in slots 9 to 25. That is, the number of the semiconductor wafers on which the surface electrodes 16 are formed is smaller than the number of the semiconductor wafers set in the load lock chamber 92. The surface electrodes 16 are formed on the main semiconductor wafers 10 one by one, and hence a time for which the later-stage main semiconductor wafers 10 (e.g., the last main semiconductor wafer 10 (in slot 8)) wait in the load lock chamber 92 is longer than a time for which the earlier-stage main semiconductor wafers 10 (e.g., the first main semiconductor wafer 10 (in slot 2)) wait in the load lock chamber 92. However, the number of the main semiconductor wafers 10 on which the surface electrodes 16 are to be formed is small, and hence a difference in waiting time is small between the earlier-stage main semiconductor wafers 10 and the later-stage main semiconductor wafers 10.

As described above, in the manufacturing method in Embodiment 1, the speed of decrease in the moisture amount on the surfaces of each of the main semiconductor wafers 10 in the load lock chamber 92 is slow, and also the difference in waiting time is small between the earlier-stage main semiconductor wafers 10 and the later-stage main semiconductor wafers 10. This leads to a small difference between an amount of moisture that exists on each of the surfaces of the earlier-stage main semiconductor wafers 10 when the surface electrode 16 is formed thereon and an amount of moisture that exists on each of the surfaces of the later-stage main semiconductor wafers 10 when the surface electrode 16 is formed thereon. Therefore, in the annealing in step S24, a difference is assumed to be small between an amount of oxygen molecules captured into Schottky interfaces of the earlier-stage main semiconductor wafers 10 and an amount of oxygen molecules captured into Schottky interfaces of the later-stage main semiconductor wafers 10. This leads to a small difference between the barrier heights of the Schottky interfaces of the earlier-stage main semiconductor wafers 10 and the barrier heights of the Schottky interfaces of the later-stage main semiconductor wafers 10. According to this manufacturing method, semiconductor devices that each has a Schottky electrode can be manufactured while variations in barrier height are suppressed.

Moreover, in the manufacturing method in Embodiment 1, the insulating layer 22 is formed on the surface of each sub semiconductor wafer 20. Since the insulating layer 22 (a silicon oxide, in particular) is more porous than a semiconductor layer, the insulating layer 22 is more prone to absorb moisture than the semiconductor layer does. Accordingly, setting the sub semiconductor wafers 20 that have the insulating layers 22 in the load lock chamber 92 enables more moisture to be supplied to the load lock chamber 92. Each insulating layer 22 formed by the CVD, in particular, is more porous on the sub semiconductor wafer 20 side. Moreover, since the openings 24 are formed in each insulating layer 22, the porous portion of the insulating layer 22 is exposed to the side surfaces of the openings 24. Due to this, more moisture is supplied to the load lock chamber 92 from the porous portion of each insulating layer 22. Moreover, in the manufacturing method in Embodiment 1, the sub semiconductor wafers 20 are rinsed with water before being set in the load lock chamber 92. Accordingly, more moisture can be applied to the sub semiconductor wafers 20 (the insulating layers 22, in particular), and more moisture can be supplied in the load lock chamber 92. Thus, the speed of decrease in the moisture concentration in the space within the load lock chamber 92 can further be slowed. Consequently, the speed of decrease in the moisture amount on each of the surfaces of the main semiconductor wafers 10 during the waiting time can further be slowed.

Figure 8:
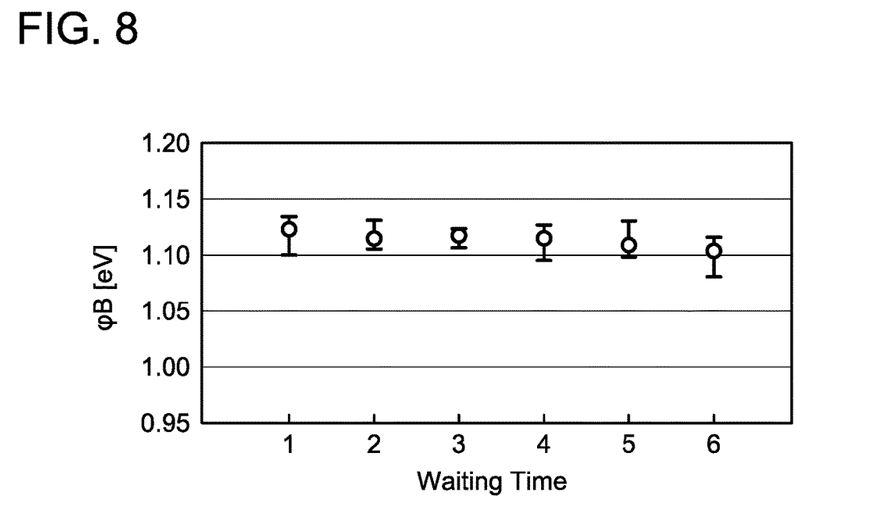
FIG. 8 is a graph illustrating a relation between waiting time and barrier height in a case of using the manufacturing method in Embodiment 1.

It should be noted that, FIG. 8 illustrates changes in barrier height φB when the Schottky electrodes are formed on the main semiconductor wafers 10 by the manufacturing method in Embodiment 1. An axis of abscissas in FIG. 8 shows the waiting time in the load lock chamber 92 with the waiting time normalized by the same method as that in FIG. 7. As is clear from a comparison between FIGS. 8 and 7, according to the manufacturing method in Embodiment 1, the rate of drop in barrier height becomes low even with the long waiting time. It can be seen from FIG. 8 that, according to the manufacturing method in Embodiment 1, more moisture is supplied in the load lock chamber 92, as a result of which the speed of drop in the moisture amount on each of the surfaces of the main semiconductor wafers 10 is slowed.

As such, in the manufacturing method in Embodiment 1, the drop in barrier height due to the waiting time less easily occurs. According to the manufacturing method in Embodiment 1, variations in barrier height can therefore be suppressed effectively.

Moreover, since the barrier height of each Schottky electrode is greatly influenced by the state of the surface of the corresponding main semiconductor wafer 10, it becomes difficult to control the barrier heights if excessive moisture is supplied in the load lock chamber 92. With use of the sub semiconductor wafers 20 as in Embodiment 1, an appropriate amount of moisture can be supplied to the load lock chamber.

It should be noted that, each of the sub semiconductor wafers 20 can be re-used. In other words, in a case where a sequence in FIG. 2 (a set of processes corresponding to steps S2 to S28 in FIG. 2) is repeated, the same sub semiconductor wafers 20 can be used repetitively throughout the repeated sequences.

It should be noted that, although the sub semiconductor wafers 20 are semiconductor wafers comprising SiC as a main material thereof in Embodiment 1 mentioned above, the sub semiconductor wafers 20 may be constituted of another material.

[Embodiment 2] In the manufacturing method in Embodiment 1 mentioned above, a semiconductor wafer that is not to become a product is used as each sub semiconductor wafer. In contrast to this, in a manufacturing method in Embodiment 2, a semiconductor wafer that is to become a product is used as each sub semiconductor wafer.

Figure 9:
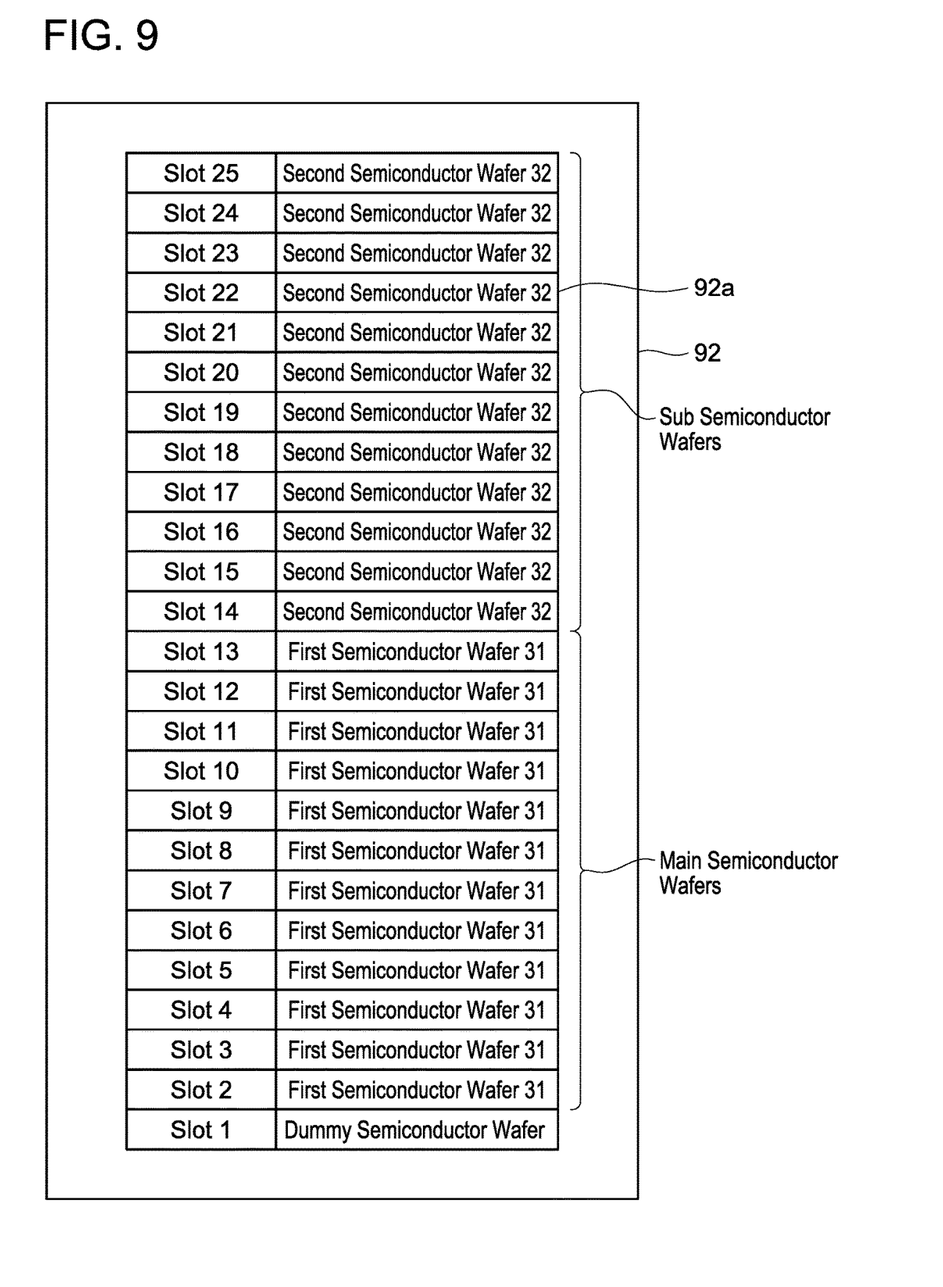
FIG. 9 is an explanatory diagram of semiconductor wafers set in a first sequence in Embodiment 2.
Figure 10:
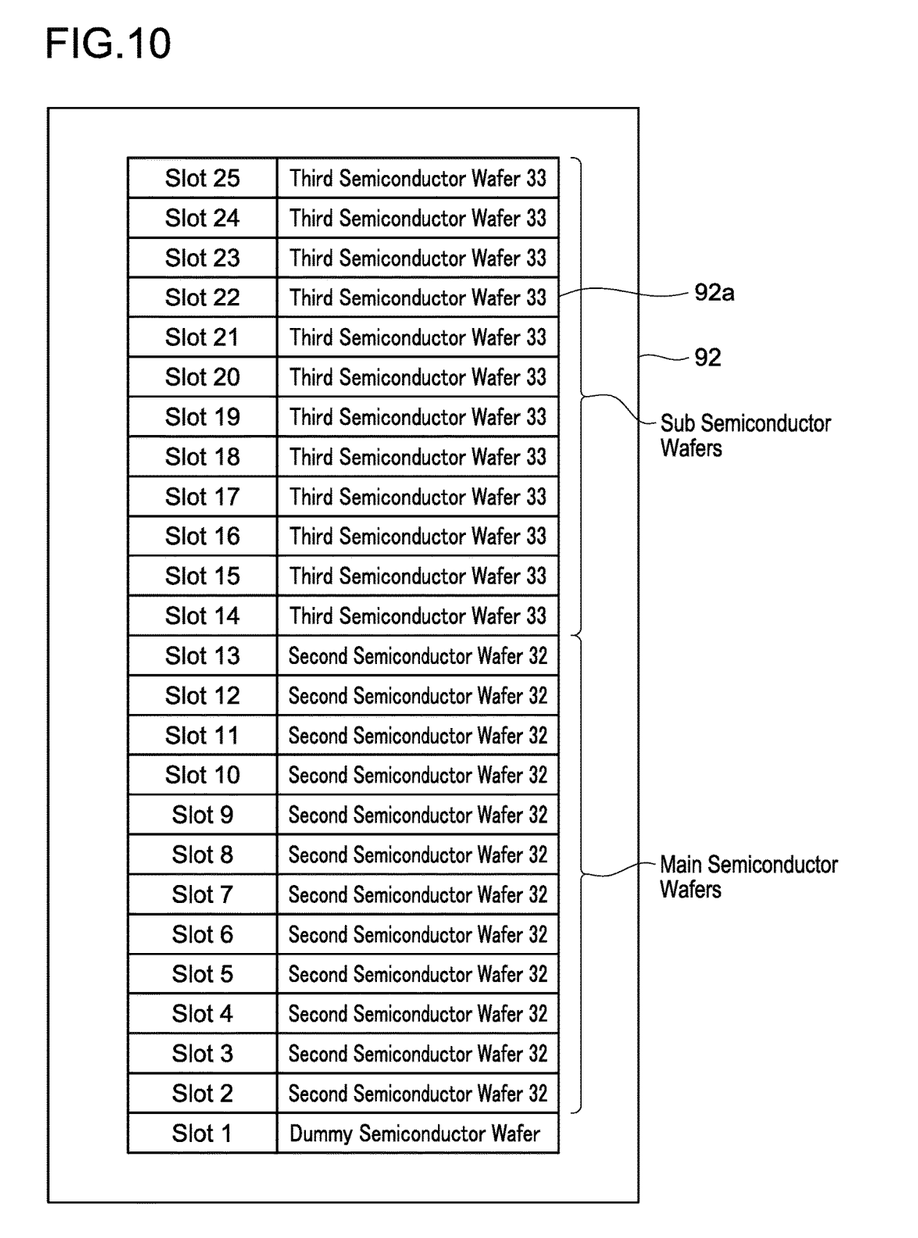
FIG. 10 is an explanatory diagram of semiconductor wafers set in a second sequence in Embodiment 2.

FIGS. 9 and 10 illustrate semiconductor wafers set in respective slots in the load lock chamber 92 in the manufacturing method in Embodiment 2. FIG. 9 illustrates the semiconductor wafers in a first sequence (set of processes corresponding to steps S2 to S28 in FIG. 2), while FIG. 10 illustrates the semiconductor wafers in a second sequence (set of processes corresponding to steps S2 to S28 in FIG. 2).

As shown in FIG. 9, in the first sequence, first semiconductor wafers 31 are set in slots 2 to 13 as the main semiconductor wafers, and second semiconductor wafers 32 are set in slots 14 to 25 as the sub semiconductor wafers. The first and second semiconductor wafers 31 and 32 each have the same structure as that of the main semiconductor wafers 10 before step S10 in Embodiment 1 (i.e., semiconductor wafers intended to become a product). By setting the semiconductor wafers as such and performing steps S10 to S26 similarly to Embodiment 1, Schottky electrodes are formed on the first semiconductor wafers 31 (i.e., the semiconductor wafers in slots 2 to 13). In the first sequence, the Schottky electrode can be formed on each of the first semiconductor wafers 31, and also, variations in barrier height are suppressed among the first semiconductor wafers 31.

After the Schottky electrodes have been formed on the first semiconductor wafers 31, the second sequence is then conducted. As shown in FIG. 10, in the second sequence, the second semiconductor wafers 32 are set in slots 2 to 13 as the main semiconductor wafers, and third semiconductor wafers 33 are set in slots 14 to 25 as the sub semiconductor wafers. The third semiconductor wafers 33 each have the same structure as that of the main semiconductor wafer 10 before step S10 in Embodiment 1 (i.e., the semiconductor wafer intended for a product). By setting the semiconductor wafers as such and performing steps S10 to S26 similarly to Embodiment 1, Schottky electrodes are formed on the second semiconductor wafers 32 (i.e., the semiconductor wafers in slots 2 to 13). In the second sequence, the Schottky electrode can be formed on each of the second semiconductor wafers 32, and also, variations in barrier height are suppressed among the second semiconductor wafers 32. It should be noted that, the third semiconductor wafers 33 are used as the main semiconductor wafers in the next sequence.

As described above, in the manufacturing method in Embodiment 2, the second semiconductor wafers 32 that were used as the sub semiconductor wafers in the first sequence are used as the main semiconductor wafers in the second sequence. That is, in the manufacturing method in Embodiment 2, the semiconductor wafers that will be a product later are used as the sub semiconductor wafers. According to the manufacturing method in Embodiment 2, since a need for a semiconductor wafer dedicated to serve as the sub semiconductor wafer (semiconductor wafer that will not become a product) is eliminated, semiconductor devices can be manufactured at a lower cost. It should be noted that, the semiconductor wafers that were used as the sub semiconductor wafers in the first sequence may be used as the main semiconductor wafers in a third or later sequences.

It should be noted that, although the surface electrodes 16 are made to Schottky-contact the semiconductor wafers in step S24 in Embodiments 1 and 2 mentioned above, the surface electrodes 16 may Schottky-contact the semiconductor wafers simultaneously with the formation of the surface electrodes 16.

Moreover, in Embodiments 1 and 2 mentioned above, the main semiconductor wafers are transferred to the film formation chamber 98 one by one (i.e., the surface electrodes 16 are formed one at a time). However, the main semiconductor wafers may be transferred to the film formation chamber 98 in a manner where a predetermined number, namely two or more, of them are transferred every time (i.e., the surface electrodes 16 may be formed two or more at a time).

Moreover, although the semiconductor wafers after the formation of the surface electrodes 16 are returned to the original slots in Embodiments 1 and 2 mentioned above, the semiconductor wafers after the formation of the surface electrodes 16 may be transferred to another position (e.g., another chamber and the like for accommodating the semiconductor wafers after the formation of the electrodes).

Relationships between constituent features in the embodiments and constituent features in the claims will be described. Step S10 in the embodiments is an example of setting of pluralities of main and sub semiconductor wafers in the claims. Steps S12 to S18 in the embodiments are an example of repeating of a wafer-transfer and electrode-formation process in the claims. Step S20 in the embodiments is an example of removal of the pluralities of main and sub semiconductor wafers in the claims. Step S24 in the embodiments is an example of making of surface electrodes Schottky-contact the main semiconductor wafers in the claims. Step S6 in the embodiments is an example of formation of insulating layers by CVD in the claims.

Some of the technical components disclosed herein will be listed hereinbelow. Each of the below technical components is independently useful.

In an example of the manufacturing method disclosed herein, each of the sub semiconductor wafers may comprise an insulating layer on a surface of the sub semiconductor wafer, the insulating layer having an opening. At this occasion, the insulating layers may be silicon oxide layers. Further, the insulating layers may be formed by CVD (Chemical Vapor Deposition) before the setting of the pluralities of main and sub semiconductor wafers.

According to this configuration, moisture easily leaves the side surfaces of the insulating layer in the openings. More moisture can therefore be supplied to the load lock chamber. Therefore, moisture leaving the surfaces of the main semiconductor wafers is suppressed, and drop in barrier height can be suppressed more effectively.

In an example of the manufacturing method disclosed herein, a sequence comprising the setting of the pluralities of main and sub semiconductor wafers, the repeating of the wafer-transfer and electrode-formation process, the removal of the pluralities of main and sub semiconductor wafers, and the making of the surface electrodes Schottky contact the main semiconductor wafers may be repeated two or more times. Throughout the repeated sequences, same semiconductor wafers may be used as the sub semiconductor wafers.

According to this configuration, the semiconductor wafers that are not to be used as products can be utilized as the sub semiconductor wafers.

In an example of the manufacturing method disclosed herein, a sequence comprising the setting of the pluralities of main and sub semiconductor wafers, the repeating of the wafer-transfer and electrode-formation process, the removal of the pluralities of main and sub semiconductor wafers, and the making of the surface electrodes Schottky-contact the main semiconductor wafers may be repeated two or more times. In each of the repeated sequences, semiconductor wafers used as the sub semiconductor wafers in its previous sequence may be used as the main semiconductor wafers.

According to this configuration, a need for semiconductor wafers dedicated to serve as the sub semiconductor wafers is eliminated.

An example of the manufacturing method disclosed herein may further comprise rinsing the sub semiconductor wafers with water before the setting of the pluralities of main and sub semiconductor wafers.

According to this method, moisture can be applied to the surfaces of the sub semiconductor wafers before the setting of the pluralities of main and sub semiconductor wafers. More moisture can therefore be supplied to the load lock chamber.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A method of manufacturing a semiconductor device, the method comprising:
    setting a plurality of main semiconductor wafers comprising SiC as a main material thereof and a plurality of sub semiconductor wafers in an electrode forming equipment which comprises a load lock chamber and a film formation chamber, wherein:
        the load lock chamber comprises a plurality of slots, and
        the main semiconductor wafers and the sub semiconductor wafers are set in respective slots of the plurality of slots of the load lock chamber;
    repeating a wafer-transfer and electrode-formation process, wherein:
        in each of the repeated wafer-transfer and electrode-formation processes, one or more of the main semiconductor wafers in the load lock chamber are transferred from the load lock chamber to the film formation chamber in a state where the load lock chamber and the film formation chamber are decompressed, and then a surface electrode is formed on the one or more of the main semiconductor wafers that have been transferred to the film formation chamber, the wafer-transfer and electrode-formation process is performed each time for a different set of one or more of the main semiconductor wafers, and the sub semiconductor wafers are stored in the load lock chamber during the repetition of the wafer-transfer and electrode-formation process;

removing the main semiconductor wafers on which the surface electrodes have been formed and the sub semiconductor wafers from the electrode forming equipment without forming an electrode on the sub semiconductor wafers by the electrode forming equipment; and making the surface electrodes Schottky-contact the main semiconductor wafers.

2. The method of claim 1, wherein each of the sub semiconductor wafers comprises an insulating layer on a surface of the sub semiconductor wafer, the insulating layer having an opening.

3. The method of claim 2, wherein the insulating layers are silicon oxide layers.

4. The method of claim 2, further comprising forming the insulating layers on the surfaces of the sub semiconductor wafers by CVD before the setting of the pluralities of main and sub semiconductor wafers.

5. The method of claim 1, wherein
a sequence comprising the setting of the pluralities of main and sub semiconductor wafers, the repeating of the wafer-transfer and electrode-formation process, the removal of the pluralities of main and sub semiconductor wafers, and the making of the surface electrodes Schottky contact the main semiconductor wafers is repeated two or more times, and throughout the repeated sequences, same semiconductor wafers are used as the sub semiconductor wafers.

6. The method of claim 1, wherein
a sequence comprising the setting of the pluralities of main and sub semiconductor wafers, the repeating of the wafer-transfer and electrode-formation process, the removal of the pluralities of main and sub semiconductor wafers, and the making of the surface electrodes Schottky-contact the main semiconductor wafers is repeated two or more times, and in each of the repeated sequences, semiconductor wafers used as the sub semiconductor wafers in its previous sequence are used as the main semiconductor wafers.

7. The method of claim 1, further comprising rinsing the sub semiconductor wafers with water before the setting of the pluralities of main and sub semiconductor wafers.

* * * * *